United States Patent
Bymark et al.

(10) Patent No.: US 6,664,318 B1
(45) Date of Patent: Dec. 16, 2003

(54) ENCAPSULANT COMPOSITIONS WITH THERMAL SHOCK RESISTANCE

(75) Inventors: Richard M. Bymark, Austin, TX (US); Frank Y. Xu, Austin, TX (US); Rolf W. Biernath, Maplewood, MN (US); Michael A. Kropp, Cottage Grove, MN (US); Wayne S. Mahoney, St. Paul, MN (US); Taun L. McKenzie, North St. Paul, MN (US); Wendy L. Thompson, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/467,455

(22) Filed: Dec. 20, 1999

(51) Int. Cl.$^7$ .................................. C08K 5/24
(52) U.S. Cl. ................ 524/261; 524/265; 524/547; 524/555; 524/556; 524/560
(58) Field of Search ................ 524/261, 265, 524/547, 555, 556, 560

(56) References Cited

U.S. PATENT DOCUMENTS

| | | | |
|---|---|---|---|
| 4,179,477 A | 12/1979 | Bockstie, Jr. ............... 525/284 |
| 4,275,319 A | 6/1981 | Davis, Jr. .................... 310/43 |
| 4,554,470 A | 11/1985 | Jerson et al. ................. 310/45 |
| 4,565,562 A | 1/1986 | Seng ........................... 65/335 |
| 4,578,425 A | 3/1986 | Santorelli .................... 525/109 |
| 4,639,503 A | 1/1987 | Hara et al. .................... 528/92 |
| 4,778,851 A | 10/1988 | Henton et al. ................ 525/65 |
| 4,888,226 A | 12/1989 | Wong ........................... 428/76 |
| 5,047,834 A | 9/1991 | Kovac et al. .................. 357/72 |
| 5,053,496 A | 10/1991 | Bertsch et al. ............... 534/886 |
| 5,420,202 A | 5/1995 | St. Clair et al. .......... 525/92 H |
| 5,461,112 A | 10/1995 | Masse et al. .............. 525/92 B |
| 5,726,216 A | 3/1998 | Janke et al. .................. 522/31 |

FOREIGN PATENT DOCUMENTS

| | | | |
|---|---|---|---|
| CA | 2164915 | 12/1995 | ........... C08L/63/00 |
| EP | 0372747 A2 | 6/1990 | ............ H01B/3/44 |
| EP | 0 565 206 A3 | 10/1993 | ........... C08L/63/00 |
| JP | 09176294 | 7/1997 | ........... C08G/59/56 |
| WO | WO 99/38196 | 7/1999 | |

Primary Examiner—Peter D. Mulcahy
(74) Attorney, Agent, or Firm—Dean M. Harts

(57) ABSTRACT

A thermomechanical-shock-resistant cured composition for solventless, hydrophobic resin encapsulation of electronic components having a glass transition temperature below 0° C. and containing a non-silicone oligomer including a flexible hydrocarbon backbone with reactive functionality, up to about 40% by weight of an adhesion promoter, and a optional viscosity-modifying component.

17 Claims, No Drawings

ENCAPSULANT COMPOSITIONS WITH THERMAL SHOCK RESISTANCE

BACKGROUND OF THE INVENTION

1. Field of the Invention

The invention relates to encapsulant compositions used for packaging electronic components and devices. More particularly the invention relates to a thermomechanical-shock-resistant, cured composition for solventless, hydrophobic resin encapsulation of electronic components comprising a non-silicone oligomer including a flexible hydrocarbon backbone having reactive functionality. The composition includes up to about 40% of an adhesion promoter by weight of the total composition.

2. Description of the Related Art

Advances in electronic circuit design have increased the number of electronic components occupying the area available on a printed circuit board. Evidence of such increases can be appreciated by considering the mounting numbers and increased versatility of electronic devices such as personal digital assistants, cellular phones, portable compact disc players, personal computers, lap-top computers and other equipment relying on electronic devices for effective performance. Progressive board space consumption, by semiconductor integrated circuit components, raises problems with a large quantity of very small contacting locations that require interconnection to outside or external circuitry. An interconnection structure, typically positioned around a space occupied by e.g. a semiconductor chip, may be referred to as a lead frame. Lead frame technology has led to tape automated bonding (TAB) technology, referring to connections to a conductor pattern placed on a tape filament. Associated with lead frame technology is another connection scheme, known as wire bonding, wherein segments are bonded to the contact or pad on a chip at one end and to an external conductor at the other end. A problem with wire bonding technology occurs when wires break during injection molding of encapsulant to surround a semiconductor device. Individual connecting wires, of the wire bonding pattern, may snap upon impact of the advancing wave of injected encapsulant material. Therefore protection of wire interconnections is essential to maintaining the electrical integrity of an electronic device.

In addition to the protection of wire bonded connections, modern electronic circuits must be able to withstand a wide variety of environmental conditions, such as exposure to moisture, heat, mobile ion contaminants and abrasion. The search for suitable protection revealed several types of sealing or encapsulating materials, including a variety of flexible polymer compositions derived from polyurethanes, polysiloxanes, polyepoxides and other organics, plastics and the like. Such compositions are now well known for providing protective layers for circuits and attached semiconductor components. Despite improvement in performance of sealing and encapsulating materials, resistance to moisture, and ion penetration still remain as problems for most materials, while selected materials are subject to specific problems. For example, deficiencies of silicone-based encapsulants include poor solvent resistance and a relatively poor level of adhesion to substrate materials.

A review of encapsulant materials shows common use of silicone compositions. Despite the problems of solvent susceptibility and poor adhesion, these materials appear to offer a better balance of properties than other, previously used, types of material. U.S. Pat. No. 4,888,226 describes an electronic device encapsulated by a silicon dioxide-containing silicone resin gel that cures with a hard protective shell. The encapsulant material is an improvement over a silicone composition, in U.S. Pat. No. 4,565,562, which could fail when subject to thermal stress, abrasion or solvent attack. Non-silicone encapsulants in combination with silicone encapsulants provide performance improvement by contributing properties that silicones lack. An example of this is provided by U.S. Pat. No. 5,047,834 wherein one material gives protection around bonded leads of the lead frame while another provides environmental protection extending over the surface of the device and the leads. A silicone encapsulant provides environmental protection and covers a filled epoxy encapsulant that surrounds the bonded leads. The combined protection of silicone and epoxy materials overcomes the problems of each used individually.

The long term successful use of epoxy compositions as potting compounds and encapsulants for electrical industries may not apply directly in electronic packaging applications. Generally, epoxy resins alone are too rigid, brittle, moisture absorbing and susceptible to thermal shock to satisfy the requirements of bonded lead protection and electronic component encapsulation. The primary problem appears to be a lack of flexibility of cycloaliphatic polyepoxides, glycidyl ethers of bisphenol A and related epoxy resins. Evidence exists of numerous attempts to improve the flexibility of epoxy resins with the goal of developing suitable electronic encapsulant materials. One frequently addressed approach uses toughener addition to increase the flexibility of epoxy resin compositions. The toughened epoxy formulation may also include a reactive diluent. U.S. Pat. No. 5,726,216, for example, describes the addition of a toughener or flexibilizer to e.g. glycidyl ethers of various phenolic compounds. Materials as tougheners for such resins include oligomers of engineering thermoplastics which contain functional groups capable of reacting with the epoxy resin during curing. Suitable oligomers may be flexible molecules with terminal reactive substituents, such as epoxy groups, at one or both ends of a long, predominantly aliphatic hydrocarbon chain. Additional references, including U.S. Pat. Nos. 4,578,425; 4,778,851; 5,053,496; 5,420,202; 5,461,112; 5,499,409; Canadian published application CA 2,164,915, and European published application EP 0 565 206, provide further evidence of physical property modification to provide more flexible epoxy resins, either by addition of toughening components that rely on molecular structure or the introduction of core/shell particles into the epoxy resin composition. In all cases, preferred compositions contain less than 40% of toughener. U.S. Pat. 4,639,503 discusses the addition of a phenol adduct of a conjugated diolefin polymer to an epoxy resin produced by reaction of epichlorohydrin and bisphenol A or a novolak resin, alicyclic epoxy resins and epoxy resins derived from halogenated bisphenol A. Up to 300 parts of phenol adduct of a conjugated diolefin polymer may be added to 100 parts of an epoxy resin to provide encapsulant compositions which, upon curing, survive pressure cooker (125° C.×200 hrs) and heat cycle (100 cycles between −40° C. and 120° C.) testing. The glass transition temperatures (Tg) of cured compositions are in the range of 60° C. to 85° C. probably due to the relatively high amount of epoxy resin in the composition.

Despite efforts, an encapsulant has yet to be found to meet the needs previously outlined and in addition survive the thermomechanical shock and outgassing testing required of today's sophisticated electronic devices and related hardware. Towards this goal, it would be beneficial to provide a material capable of flowing about an electronic device, to encase it, with appropriate adhesion, electrical properties, thermal stability, moisture resistance, solvent resistance, and shock resistance after curing to yield an encapsulant hard enough to resist penetration but soft enough to cushion impact.

SUMMARY OF THE INVENTION

The invention provides novel encapsulant compositions containing major quantities of components unlike any of the polyurethane, polyepoxide and polysiloxane base resins previously investigated. One version of an encapsulant composition, according to the present invention, includes a linear hydrocarbon chain, usually in the form of a polyolefin oligomer providing a flexible backbone with reactive functionality attached to the oligomer chain. The polyolefin oligomer is hydrophobic, providing moisture resistance, while the linear hydrocarbon chain yields a flexible cured encapsulant. Hydrophobic materials generally do not adhere well to other materials. An adhesion promoter, added to a polyolefin oligomer provides a second component for a liquid oligomer composition having the characteristics required of an encapsulant material. Addition of the second component to the composition provides cured encapsulant structures with desirable characteristics of adhesion to selected substrates, and, depending on its other properties, an adhesion promoter may also add to thermal stability over extended periods of time. Other materials may be added to assist with compatibility of the main components and to produce cured compositions with the required modulus and coefficient of thermal expansion (CTE).

Some packaging applications require encapsulant formulations with extremely low viscosities before curing in order to penetrate confined spaces in the proximity of electronic components. In such applications, liquid oligomer compositions comprising liquid oligomer and an adhesion promoter also include a viscosity-modifying component.

Viscosity-modifying components used herein are different from low molecular weight reactive diluents known for use in encapsulants. Low molecular weight diluents become part of the covalent resin network upon curing. The disadvantage of use of such diluents appears when species associated with the diluent impart characteristics that may be detrimental to the cured resin network. For this reason, selection of viscosity-modifying components for the present invention emphasizes the need for viscosity adjustment without adverse impact upon the properties of the cured composition. Preferably, the product of curing an encapsulant composition retains the protective, repellent properties of the liquid oligomer, the adhesion building benefits of the adhesion promoter and optionally viscosity adjustment provided by a viscosity-modifying component. Thermal curing of the encapsulant composition produces an interpenetrating network of crosslinked polymers to hold the liquid oligomer, adhesion promoter and the viscosity-modifying component, if present, in a suitably condensed condition to prevent any undesirable emissions of low molecular weight contaminants. During formation of the interpenetrating network, the adhesion promoter and viscosity-modifying component enter different polymer systems. Either one may join with a liquid oligomer, for polymer generation, but not with each other. In most instances the generation of independent, cured polymer networks occurs without noticeable phase separation.

Preferred compositions of the current invention are low viscosity fluids that yield cured encapsulants having glass transition temperatures (Tg) below about 0° C. The viscosities of the low viscosity fluids extend from about 1,000 cps to about 200,000 cps to allow the uncured encapsulant composition to flow into all of the spaces over, under and around the devices to be encapsulated. After curing, due to its low Tg, the encapsulant remains relatively soft and pliable and in optimum condition to cushion and protect delicate bonded leads from damage. Tg values for cured compositions, according to the present invention, indicate that the rubbery to glassy state transition occurs at temperatures much lower than any previously reported epoxy for electronic component encapsulants.

A variety of reactive groups, useful for the present invention, may be attached to the linear hydrocarbon chain. Such groups include epoxy groups, (meth)acrylate groups, carboxyl groups, hydroxyl groups, isocyanate groups, amine groups, allyl groups, phenolic groups, vinyl groups, vinyl ether groups, anhydride groups, alkyd groups, cyanate ester groups, silyl groups, mercapto groups, and the like.

Thermally curable encapsulant compositions, according to the present invention, show robust performance by surviving aggressive evaluation via high temperature and high humidity conditioning and thermal shock requirements of JEDEC 1 testing, pressure cooker testing, thermal cycling and high temperature storage.

More particularly, these thermomechanical-shock-resistant cured compositions for solventless, hydrophobic resin encapsulation of electronic components comprise a non-silicone oligomer including a flexible hydrocarbon backbone having reactive functionality, preferably terminal reactive functionality, an adhesion promoter; and optionally a curable viscosity-modifying component. The composition includes up to about 40% by weight of the adhesion promoter, and the cured composition has a glass transition temperature below 0° C.

In cases where the cured encapsulant includes an interpenetrating polymer network, the invention provides a thermomechanical-shock-resistant cured composition for solventless, hydrophobic resin encapsulation of electronic components comprising a plurality of polymers forming the interpenetrating polymer. Interpenetrating network formation occurs by curing a liquid composition comprising a non-silicone oligomer, including a flexible hydrocarbon backbone with reactive functionality; an adhesion promoter; and a viscosity-modifying component. The liquid composition includes up to about 40% by weight of adhesion promoter. The adhesion promoter enters a different polymer of the interpenetrating network from the viscosity-modifying component and the cured composition has a glass transition temperature below 0° C.

As used herein, the following terms have the defined meanings.

1. The term "encapsulant composition" means the final uncured composition applied around an electronic component or device to encapsulate the component or device, protecting it from heat and environmental contamination.
2. The term "cured encapsulant" is the protective mass around an electronic component or device after curing an encapsulant composition.
3. The term "liquid oligomer composition" means the composition containing a liquid polyolefin oligomer and an adhesion promoter with no viscosity-modifying component.
4. The term "liquid oligomer" means a prepolymer structure, having reactive groups attached to a flexible, essentially linear backbone containing between about 20 and about 700 carbon atoms and having a molecular weight from about 300 to about 10,000.

5. The term "viscosity-modifying component" means a low molecular weight, low viscosity liquid sufficiently reactive to participate in a curing reaction to produce a crosslinked polymer network.
6. The term "(meth)acrylate" designates the use of either methacrylate functional species or acrylate functional species.
7. The terms "glass transition temperature" and "Tg" mean a property of a polymer, defined as the temperature at which the polymer changes between a rubbery and a glassy state without any change in phase.
8. The term "thermal shock testing" refers to the explosive production of bubbles or craters in the mass of a cured and preconditioned encapsulant when the temperature of the mass is rapidly raised from room temperature to at least 220° C. by holding the encapsulant in contact with a hot-plate for a specified amount of time. Moisture in the encapsulant layer responds by expanding, vaporizing explosively to the extreme jump in temperature causing voids or vapor pockets in the coating. For this reason, samples that fail thermal shock testing are said to exhibit "popcorning."

The beneficial effects, for thermosetting encapsulants disclosed herein, will be further addressed in the following discussion of preferred compositions.

DETAILED DESCRIPTION OF THE INVENTION

The present invention provides electronic grade encapsulants, free of silicone contamination and capable of passing JEDEC 1 (J1) high temperature and high humidity conditioning and thermal shock testing. Such encapsulants are useful in applications such as electronic packaging, especially chip scale packaging. A modified JEDEC 1 test has been used due to unavailability of a reflow oven. Encapsulant compositions disclosed herein are exemplary of the invention, which may exhibit variations depend upon the application, e.g., improved adhesion, thermal shock resistance, low outgassing etc., using liquid polymers having a flexible backbone and reactive functional groups attached at various points on the chain. Useful liquid polymers are hydrophobic and contain only inconsequential amounts of ionic species. Thermal curing provides environmentally protective, flexible, resilient encapsulant coatings which cushion bonded leads to prevent lead separation from a device contact or circuit trace. Suitable materials for liquid polymers, according to the present invention, contain polyolefin oligomers having functional group-reactivity, preferably terminal group-reactivity, to promote crosslinking and curing of an encapsulant composition under the influence of heat. Molecular weights, for liquid polymers, average from about 300 to about 10,000, preferably from about 500 to about 7,000. Olefin monomers, used to produce liquid oligomers, according to the present invention, include monoolefinic species, such as isobutylene, various alkyl-substituted ethylene, conjugated diolefins having 4 to 10 carbon atoms, such as butadiene, isoprene or 1,3, pentadiene, piperylene, methylpentadiene, phenylbutadiene, 3,4-dimethyl-1,3-hexadiene,4,5-diethyl-1,3-octadiene and the like. These monomers may be used alone for homopolymer formation or in combination with other monomers to provide copolymers with the desired flexible oligomer backbone. Preferably any unsaturation has been removed from the flexible hydrocarbon backbone by hydrogenation. Suitable copolymerizing monomers include aromatic vinyl monomers, such as styrene, alpha methyl-styrene, vinyltoluene, divinylbenzene, vinyl napthalene or acrylonitrile.

A variety of reactive groups, useful for the present invention, may be attached to the linear hydrocarbon chain. Such groups include epoxy groups, (meth)acrylate groups, carboxyl groups, hydroxy groups, isocyanate groups, amine groups, allyl groups, phenolic groups, vinyl groups, vinyl ether groups, anhydride groups, alkyd groups, cyanate ester groups, silyl groups, and mercapto groups. Useful commercial examples of these reactive groups include L207, available from Shell Chemical Co., TEAI, 1000 available from Nissho Iwai Corporation, and EP600A, available from Kaneka, KK of Japan.

Liquid oligomers, having from 20 to 700 carbon atoms in the flexible backbone, are inadequate to perform the task of encapsulation of electronic components because of deficiencies in the strength of the adhesive bond of cured compositions to printed circuit and related substrates. Amounts of adhesion promoters, added to liquid olefin-based oligomers, impart effective levels of adhesion, allowing the encapsulant compositions, so produced, to retain the hydrophobic properties of the liquid oligomer and strength of bonding associated with the adhesion promoters.

Adhesion promoters include organofunctional silane coupling agents, and alkoxy silane modified polyenes, polyols and polyanhydrides. Organofunctional silane coupling agents contain a hydrolyzable group (X) and an organofunctional group (Y) in compounds having the structure $X_3SiRY$ and $X_2R'SiRY$. Typically, silane coupling agents with amine, epoxy, (meth)acrylate, vinyl, ureido, sulfur, or isocyanato organofunctional groups are selected. The preferred hydrolyzable group is an alkoxy group.

Encapsulant compositions containing only a liquid oligomer and an adhesion promoter, referred to herein as liquid oligomer compositions, have viscosities in the range from about 20,000 centipoise (cps) to about 200,000 cps. In some cases the filling of spaces, especially between an electronic component and circuit substrate, only occurs for fluid compositions with viscosities below this range. Under such circumstances, addition of a viscosity-modifying component will provide fluid encapsulant compositions capable of flowing into the narrowest of crevices.

The addition of viscosity modifiers to encapsulant compositions is not new. For example, U.S. Pat. No. 5,461,112 describes a mode of matrix toughening, to improve flexibility of a brittle aromatic epoxy resin matrix, by incorporating a flexible additive (diluent) molecularly into the covalent resin network (see column 7, lines 45–51). This mode alone, would give improvments in toughness but would cause significant degradation of the strength and rigidity of the matrix. The use of the term reactive diluent exists in other references describing epoxy resin systems used as encapsulants for electronic devices. Reactive diluents, that become part of the covalent resin network during curing, appear to adversely affect properties of the cured encapsulant. Avoidance of such adverse impact is necessary to provide the benefits of the invention. A preferred viscosity-modifying component is one that contributes the benefit of low viscosity without increasing the Tg excessively and affecting the ultimate hydrophobicity of the solidified mass that represents the protective encapsulant body. Achievement of such a condition depends upon adding a viscosity-modifying component that is miscible with a liquid oligomer encapsulant composition. The viscosity-modifying component lowers the viscosity of the total composition to facilitate formation of a complete envelope around an electronic device. Both the liquid oligomer composition and the viscosity-modifying component may respond to the same stimulus for curing, such as heat or actinic radiation, but the curing reaction produces a system of interpenetrating polymer networks such that the viscosity-modifying component and adhesion promoter enter different networks.

Viscosity-modifying components, according to the present invention, differ from previously disclosed reactive diluents that adversely affect properties of the cured resin or need phase separation to enhance the properties of cured encapsulant compositions. U.S. Pat. No. 5,461,112, e.g., states (column 7, lines 6–10), "In order to get the desired balance of properties for the compositions of the present invention, i.e. improved toughness with little or no sacrifice in strength, rigidity, or adhesion, it is important that there be some phase separation between the components of the final cured product." In contrast, the present invention produces final cured product, including generally transparent, resilient masses, showing essentially no evidence of phase separation.

Suitable viscosity-modifying components include low molecular weight liquids such as isooctyl acrylate, isobornyl acrylate, 2-ethylhexyl acrylate, benzyl acrylate, butyl acrylate, 4-cyanobutyl acrylate, 2-cyanoethyl acrylate, cyclohexyl acrylate, 2-ethoxyethyl acrylate, 2-ethoxypropyl acrylate, ethyl acrylate, 2-ethylbutyl acrylate, heptyl acrylate, hexyl acrylate, isobutyl acrylate, 2-methylbutyl acrylate, 3-methylbutyl acrylate, nonyl acrylate, 3-pentyl acrylate, propyl acrylate, dodecyl methacrylate, 2-ethylhexyl methacrylate, octyl methacrylate, 1,4-butanediol diacrylate, and 1,6-hexandiol diacrylate.

When used, the viscosity-modifying component comprises up to about 30% of the encapsulant composition by weight.

Preferably the cured polymer network, including a viscosity-modifying component, crosslinks sufficiently to prevent any outgassing of the encapsulant composition. Crosslink enhancement may rely upon the incorporation of multifunctional monomers in the encapsulant composition. For example, an encapsulant composition using isooctylacrylate, as a viscosity-modifying component, may also contain a multifunctional (meth)acrylate monomer, such as trimethylolpropane trimethacrylate for acrylate network formation which prevents outgassing associated with fugitive species.

In contrast to encapsulant compositions disclosed in prior art references, the encapsulant compositions according to the present invention, which optionally include a viscosity-modifying component, produce at least two independent cured polymer networks. While not wishing to be bound by theory, it is believed that a cured encapsulant, as disclosed herein, exists as a protective mass comprising networks of interpenetrating polymers, sufficiently crosslinked to avoid problems of outgassing or moisture absorption while retaining the durability and resiliency needed to physically protect an encapsulated device.

One example of an encapsulant system according to the present invention includes an epoxy functional polyolefin, designated as L207, and available from Shell Chemicals. This liquid oligomer has an epoxy functional end group separated from a primary hydroxyl functionality by a poly(ethylene/butylene) backbone. The material (L207) has an epoxy equivalent weight (EEW) of 590 and a hydroxyl equivalent weight of 6,600. In the presence of a curative, such as dodecenyl succinic anhydride (DDSA), L207 has the functionality to produce a lightly crosslinked structure. Such a structure has little value as an encapsulating structure due to insufficient adhesion. Alkoxysilanes impart improved adhesion to the liquid oligomer. However, low molecular weight alkoxysilanes have poor compatibility with L207 and only very limited amounts may be added directly to this type of epoxy/hydroxy functional polyolefin oligomers. Adhesion improvement via direct silane addition is not sufficient, therefore, to prevent failure under conditions used for JEDEC 1 thermal shock testing. A way to increase adhesion promoter concentration by grafting silane functionality onto a molecule having greater compatibility with polyolefin oligomers has now been discovered. As an example, PRIPOL 2033, a dimer diol available from Unichema, reacts with an alkoxysilane to produce an adhesion promoting species that effectively increases the amount of silane in an encapsulant composition. The silylated product incorporates sufficient alkoxysilane adhesion promoter to provide a cured encapsulant that survives JEDEC 1 test procedures. Reactions involving maleinized polybutadiene (Ricon 130 MA8) and vinyl functional polybutadiene (RICON® 156) proceed in similar fashion to those using PRIPOL® 2033 to provide treated materials that include silyl functionality by grafting the target polybutadiene with 3-mercaptopropyltriethoxysilane and vinyltriethoxysilane.

As described above, the liquid oligomer is subject to modification only by an adhesion promoter providing a liquid oligomer composition with no viscosity-modifying component. This liquid oligomer composition will meet JEDEC 1 requirements, without need for a viscosity-modifying component. However, addition of an acrylate monomer, e.g., isooctyl acrylate, which reduces viscosity, allows fluid penetration into confined spaces for complete envelopment of an electronic device, providing an extended range of use for the liquid oligomer compositions. Using a thermal cure mechanism, the liquid oligomer composition may develop a polymer network using an anhydride curative, while the isooctyl acrylate develops a separate, but compatible network, by a peroxide initiated cure mechanism. In this way the adhesion promoter enters a different polymer network than the viscosity-modifying component, during curing. The composition may include a multifunctional (meth)acrylate monomer, to interact with the viscosity-modifying component, to generate a cured acrylate network of the desired crosslink density to prevent gas or contaminant discharge. Due to its greater concentration in the total encapsulant composition, the cured oligomer composition has a greater influence on the properties of the cured encapsulant mass.

Anhydride curing agents, suitable for use with epoxy functional liquid oligomers, may contain one or more anhydride functional groups. Curing agents may be selected from phthalic anhydride, substituted phthalic anhydrides, hydrophthalic anhydrides, substituted hydrophthalic anhydrides, succinic anhydride, substituted succinic anhydrides, halogenated anhydrides, multifunctional carboxylic acids, and polycarboxylic acids. Preferred anhydride curing agents include phthalic anhydride, dodecenyl succinic anhydride, tetrahydrophthalic anhydride, nadic methyl anhydride, hexahydrophthalic anhydride, pyromellitic dianhydride, and methyltetrahydrophthalic anhydride, and the like. In addition, polysebacic polyanhydride (PSPA), polyazelaic polyanhydride (PAPA), 5-(2,5-dioxotetrahydrofuryl)-3-methyl-3-cyclohexene-1,2-dicarboxylic anhydride, trimellitic anhydride, maleinized polybutadiene, polyoctadecene maleic anhydride copolymer also provide adequate curing.

Addition of a curing catalyst or accelerator increases the rate of thermal cure by anhydride curing agents. Suitable curing accelerators include substituted imidazoles, and zinc catalysts such as zinc 2-ethylhexanoate and zinc stearate.

An acrylate functional liquid oligomer may be used as an alternative to the epoxy functional liquid oligomer, described previously. This approach retains the preferably hydrogenated linear oligomer backbone so as to preserve the desirable properties of hydrophobicity and flexibility. Pendant and terminal acrylate functionality associated with the liquid oligomer provide sites for crosslink formation between oligomer chains to produce the protective, cured encapsulant structure around an electronic component or device. Consistent with liquid oligomers according to the present invention, those with acrylate functionality exhibit some deficiencies in adhesion. Adhesion promoters, in this case, may include epoxy functional materials. Addition of epoxy functional adhesion promoters improves adhesion of encapsulant compositions to allow resulting, cured encapsulated components to withstand the rigors of thermal shock testing. The adhesion promoter may also include a silane for further adhesion enhancement. Suitable silanes include γ-glycidoxypropyltrimethoxysilane and γ-ureidopropyltrimethoxysilane. As before, the combination of liquid oligomer and adhesion promoter is referred to, herein, as the liquid oligomer composition.

Depending on its viscosity, the acrylate functional liquid oligomer composition may require inclusion of a viscosity-modifying component to allow complete filling of the narrowest gaps in the proximity of the electronic component or device to be encapsulated. As stated previously, the addition of a viscosity-modifying component contributes the benefit of low viscosity, to an encapsulant composition, without significantly altering the useful properties of the cured encapsulant.

Previous reference to the existence of multiple polymer networks, also termed interpenetrating networks herein, applies to encapsulant compositions containing acrylate functional liquid oligomers with epoxy functional adhesion promoters and viscosity-modifying components. In this case, the viscosity-modifying components combine with the liquid oligomer, under the influence of a free radical initiator, to form a first polymer network, while the epoxide adhesion promoter forms a second, separate polymer network by anhydride curing. Any adhesion enhancing silane will include suitable reactive groups to participate in polymer formation with the epoxy functional adhesion promoter. The cured encapsulant structure contains interpenetrating polymer networks essentially free from phase separation, with properties suitable for electronic component or device protection while meeting all requirements related to thermal shock testing. Table 1 below, contains a variety of formulations according to the invention. Table 2 below, provides examples of encapsulant formulations containing acrylate functional liquid oligomers, epoxy functional adhesion promoters and viscosity-modifying components, which may include isooctyl acrylate, isobornyl acrylate. A preferred acrylate functional liquid oligomer is a hydrogenated polybutadiene diacrylate with a molecular weight of about 1000, available from Nissho Iwai Corporate as TEAI 1000.

Adhesion promoters for use with acrylate functional liquid oligomers include, epoxy resins such as RSL 1462, cycloaliphatic epoxies, and related epoxies, and silanes including γ-glycidoxypropyltrimethoxysilane and γ-ureidopropyltrimethoxysilane, as well as those disclosed, supra.

Viscosity-modifying components for acrylate functional liquid oligomers may be selected from the same materials used with epoxy/hydroxy functional liquid oligomers, e.g. L 207, such as low molecular weight, liquids including isooctyl acrylate, isobornyl acrylate, 2-ethylhexyl acrylate, benzyl acrylate, butyl acrylate, 4-cyanobutyl acrylate, 2-cyanoethyl acrylate, cyclohexyl acrylate, 2-ethoxyethyl acrylate, 2-ethoxypropyl acrylate, ethyl acrylate, 2-ethylbutyl acrylate, heptyl acrylate, hexyl acrylate, isobutyl acrylate, 2-methylbutyl acrylate, 3-methylbutyl acrylate, nonyl acrylate, 3-pentyl acrylate, propyl acrylate, dodecyl methacrylate, 2-ethylhexyl methacrylate, octyl methacrylate, 1,4-butanediol diacrylate, and 1,6-hexandiol diacrylate.

In all cases, cured encapsulant compositions, according to the present invention, exhibited glass transition temperatures below 0° C. This stands in sharp contrast to cured encapsulants previously reported wherein significantly higher values, in the range of 50° C. to 120° C., were common. Although not wishing to be bound by theory, it appears that encapsulants based upon liquid oligomers, having reactive groups attached to an essentially non-branched hydrocarbon backbone, preferably fully hydrogenated, remain in a flexible rubbery state as reflected by such low Tg values. Previously used epoxy based encapsulants started with conventional epoxy resins and added tougheners to provide flexibility and toughness. In this case, Tg values >50° C. indicate the presence of the epoxy resin as the major component.

Fillers may be used to form filled encapsulant compositions according to the invention. Useful fillers include, but are not limited to, clay, silane treated nanoparticle silicas (or nano-silicas), having diameters of from about 4 to about 75 nm; fumed silica, fused silica, mineral and fibrous fillers such as quartz powder, fused quartz, aluminum oxide, glass powder, mica, kaolin, dolomite, graphite, soot, and also carbon fibers and textile fibers. Preferred fillers include fused silica and clay. Compositions of the invention may also have pigments dispersed therein to achieve various colors, if desirable.

Liquid oligomer compositions and encapsulant compositions of the invention may also include other useful adjuvants such as antioxidants, antistatic components, defoamers, and the like, in such amounts as will not effect the essential properties of the compositions.

TEST METHODS

Modified Method for JEDEC 1 Thermal Shock and Moisture Resistance Testing JEDEC 1 (J1) conditioning and thermal shock testing includes the following steps:

Step 1

Precondition the package or polyimide/encapsulant/silicone die sandwich fixture at 85° C./85% RH for 168 hours (7 days). Typical encapsulant thickness is 5 mil.

Step 2

Equilibrate the package at room temperature from 15 minutes to 4 hours.

Step 3

Rapidly heat the package or sandwich fixture by placing silicon die side against a hot plate previously heated to 220° C. Duration of contact between the hot plate and package is usually sixty (60) seconds. Evidence of gas generation, such as bubbling or foaming or ballooning of the flex circuit, indicates failure. Preferably there will be no visible change in the condition of the package and sandwich fixture. Material attributes to prevent failure include, low moisture absorption, good toughness, good adhesion, and high thermal stability.

A typical polyimide/encapsulant/silicone die sandwich fixture is made by laying two strips of 125 micrometers (5 mil) thick pipe thread Teflon® shims (3 mm wide) at edges of a Kapton® polyimide film (15×15 mm) from E. I. duPont de Nemours & Co., Inc. A silicon die (10×15 mm) is subsequently laid on the top of the Teflon® shims. Liquid encapsulant composition is then wicked into the 125 micrometers (5 mil) space between silicon die and Kapton®. Following the cure of encapsulant, Teflon® shims are removed.

Pressure Cooker Test

The pressure cooker test involves exposing the package to conditions of temperature (121° C.), pressure (2 atmospheres), and relative humidity (100%) for increasing amounts of time, from 96 hours to 168 hours and finally to 500 hours. After each successive time period, package inspection addresses several conditions including encapsulant cracking or reversion to a former liquid state.

High Temperature Storage

During high temperature storage, the encapsulated electronic component resides in air oven maintained at 150° C. for two (2) weeks. After heat exposure, samples undergo testing for hardness and appearance.

Tg Measurement Using Dynamic Mechanical Analysis (DMA)

Dynamic Mechanical Analysis (DMA) instruments usually employ forced vibration conditions to deform a sample and study its viscoelastic response. The instruments have the capability of not only varying the applied frequency but also the temperature. Therefore, DMA falls under the broad terminology of thermal analysis and may be used to measure the glass transition temperatures (Tg) of a material.

The glass transition temperature (Tg) is a property of a polymer and is defined as the temperature at which the polymer changes between a rubbery to a glassy state without any change in phase. Below the Tg polymeric materials undergo considerable changes in their physical properties, becoming stiff instead of flexible. Apart from hardness and brittleness, other properties that are affected by the Tg are thermal expansion coefficients, heat capacity and dielectric constants.

DMA measures a stress-strain relationship described by the following sinusoidal equations:

$$\sigma = \sigma_0 \sin(\omega t + \delta)$$

$$\sigma = \sigma_0 \sin(\omega t)\cos \delta + \sigma_0 \cos(\omega t)\sin \delta$$

where $\sigma$ is the stress, $\omega$ the angular frequency, t is the time and $\delta$ is the phase angle. The strain ($\epsilon$) can be obtained by:

$$\epsilon = \epsilon_0 \sin(\omega t)$$

The stress and strain components can be either in-phase or 90° out-of-phase with each other. When stress is in-phase with strain, the component is labeled as "real" with an associated value of $\sigma_0 \cos \delta$. The "imaginary" component is 90° out-of-phase with strain and corresponds to $\sigma_0 \sin \delta$. By resolving the stress-strain components, a real and imaginary component of modulus can be obtained:

$$\sigma = \epsilon_0 E' \sin(\omega t) + \epsilon_0 E'' \cos(\omega t)$$

where the real part of the modulus, E', is defined as $E' = (\sigma_0/\epsilon_0)\cos \delta$ and is known as the storage modulus which is a measure of recoverable strain energy in a deformed body since it is related to the storage of energy in the form of potential energy. The imaginary component of the modulus E" is defined as $E'' = (\sigma_0/\epsilon_0)\sin \delta$ where E" is the loss modulus and is associated with the description of energy as heat due to the deformation of the material. Finally, the ratio E"/E' yields the loss tangent or damping factor (tan $\delta$) which is the ratio of energy lost per cycle to the maximum energy stored and therefore recovered per cycle.

The dynamic mechanical analysis curve shows E' and/or E" and/or tan $\delta$ plotted as a function of time or temperature. In general, the most intense peak observed for either E" or tan $\delta$ (and significant inflection for E') corresponds to the glass transition and is typically labeled as the α-transition. It is important to note that the Tg, determined by DMA is not only heating-rate dependent but also frequency dependent. Therefore, Tg values obtained by DMA are generally different from that obtained by static techniques such as differential scanning calorimetry (DSC).

Method

A Rheometrics® dynamic mechanical analyzer with a 3 point bonding apparatus was used with Rhios software. In this system, a sinusoidal strain is applied to a vibrator unit using a sinusoidal current. The strain imposed upon the specimen is therefore directly related to the amount of current delivered to the vibrator. All the specimens were studied between −120° C. and 200° C. using liquid nitrogen as the coolant. The fixed frequency used was 1Hz with a heating rate of 2° C. min$^{-1}$.

The rectangular specimens were 2 mm thick, 25 mm long and 12 mm wide. The glass transition temperature values were obtained from the DMA curves and are derived from maximum in the tan $\delta$ vs. temperature curve.

Material Descriptions

Epoxy Functional Polyolefin L207, available from Shell Chemical Co., has an epoxy functional end group separated from a primary hydroxyl functionality by a poly(ethylene/butylene) backbone. L207 has an epoxy equivalent weight (EEW) of 590 and a hydroxyl equivalent weight of 6,600.

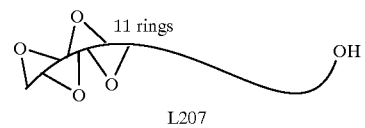

L207

PRIPOL 2033, a dimer diol (available from Unichema) has an hydroxyl equivalent weight (HEW) of 278.

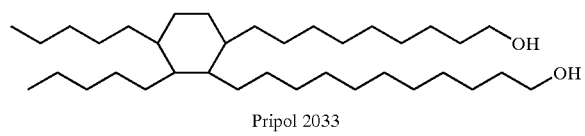

Pripol 2033

Isocyantopropyltriethoxysilane—A1310 (MW 247) is available from Witco Corporation.

A1310

Maleinized Polybutadiene is a liquid resin with a MW of 3,100 and an AEW 1153–1240 (available from Ricon Resins Inc. as RICON 130MA8).

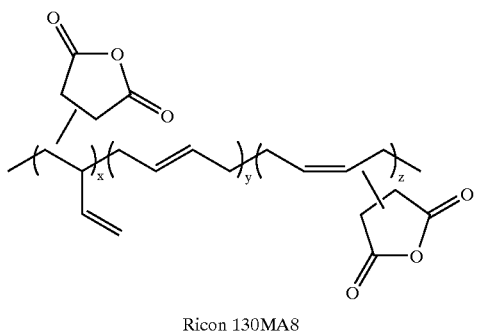

Ricon 130MA8

Dodecenyl Succinic Anhydride—DDSA—(AEW 266) is available from Lonza Inc.

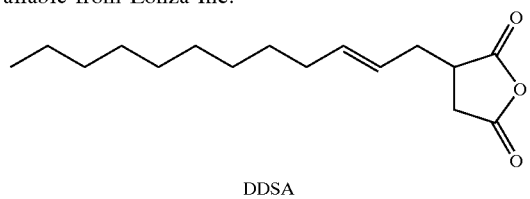

DDSA

Isooctylacrylate—IOA—is a viscosity-modifying component.

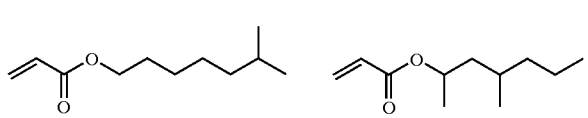

IOA

Isobornylacrylate—IBOA—is a viscosity-modifying component.

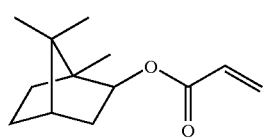

IBOA

Diglycidyl Ether of Bisphenol A—RSL1462—(DGEBA), has a epoxy equivalent weight of 190 and is available from Shell Chemical. This epoxy adhesion promoter provides a second polymer network.

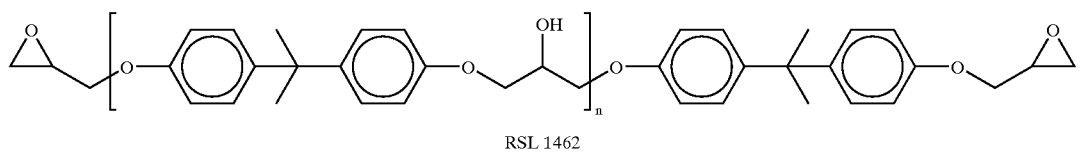

RSL 1462

Zinc 2-ethylhexanoate is an epoxy-cure catalyst available from Strem Chemicals.

BYK052 is an organic defoamer from BYK-Chemie USA.

Hydrogenated Polybutadiene Diacrylate—TEAI-1000—with M.Wt. about 1000. This material is included in the composition as a hydrophobic liquid oligomer component.

TEAI-1000

Vinyl Functional Polybutadiene—RICON 156, available from Ricon Resins, Inc.

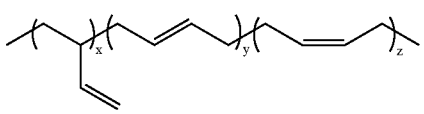

Ricon 156

γ-glycidoxypropyltrimethoxysilane—A 187 is an epoxy-functional silane available from Witco Corporation.

γ-ureidopropyltrimethoxysilane—Y11542 is a ureido-functional silane available from Witco Corporation.

Silyl Functional Adhesion Promoters Structure I React PRIPOL 2033 with isocyantopropyltriethoxysilane (A1310)

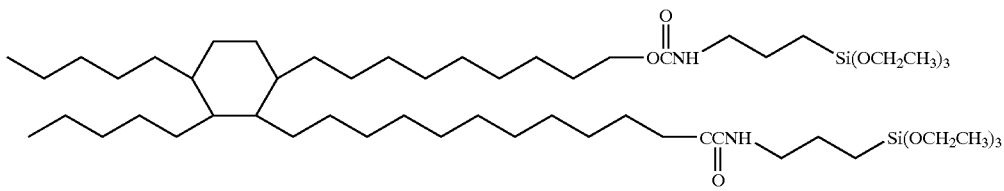

The following silylated products also find use according to the present invention but cannot be represented by definitive structures because grafting occurs randomly between the specified silanes and vinyl groups in the RICON molecules.

Reaction product of RICON 130MA8 with vinyltriethoxysilane(A 151), available from Witco Corporation.

Reaction product of RICON 130MA8 with 3-mercaptopropyltriethoxysilane (A 189), available from Witco Corporation.

Reaction product of RICON 156 with 3-mercaptopropyltriethoxysilane (A 189), available from Witco Corporation.

EXPERIMENTAL

Method of Preparation of Siloxy-Functional Adhesion Promoters

Reaction of PRIPOL 2033 with Isocyantopropyltriethoxysilane (A1310)

400 g Priopl® 2033 diol and 350 g Silane A1310 (1:1.97 mol) were charged into a round bottom flask equipped with stirrer, vacuum pump and heating mantle. The ratio of two reactants was selected to ensure that there was an excess amount of hydroxyl group remaining to react with the epoxy. The mixture was continuously stirred under a reduced pressure of less than 30 mm Hg as the temperature was raised. At 90° C. a reaction occurred which caused a moderate exotherm. After the exotherm ceased, the temperature was reset to 105° C. with continuing moderate agitation and vacuum for approximately 3 to 4 hours. The time was dependant on the rate of reactivity of the isocyanate. After 3 hours the vacuum was broken using 100% nitrogen and a small sample was taken for Fourier Transform Infrared Spectrometry (FTIR) analysis. Vacuum and agitation were continued once the sample had been obtained. When the FTIR analysis showed the absence of the isocyanate peak at 2270 cm$^{-1}$, the reaction was complete. Vacuum was then broken using 100% nitrogen, and the adduct was allowed to cool to room temperature with a nitrogen blanket and then poured into a storage container. The storage container was purged with 100% nitrogen prior to sealing. (If FTIR analysis shows remaining isocyanate then moderate agitation and vacuum are continued with FTIR sampling done every 30 minutes until the isocyanate peak is gone.) The resulting product is identified below as Compound A.

Reaction of RICON 130MA8 with Vinyltriethoxysilane (A1310)

In formulation Example 2 (see Table 1), 10.0 g of RICON 130MA8 and 1.23 g of vinyltriethoxysilane (1:2 molar ratio) were reacted, under nitrogen at 132° C. for 2 hours in the presence of 0.22 g TRIGONOX 21 (peroxide initiator from Akzo Nobel). Upon completion of the reaction the product was evacuated and allowed to cool to room temperature. The resulting product is identified as Compound B.

Reaction of RICON 130MA8 with 3-mercaptopropyltriethoxysilane

RICON 130MA8 (10.0 g) was added to a solution containing 0.23 g of KB-1 (photoinitiator from Sartomer) in 1.54 g of 3-mercaptopropyltriethoxysilane. After thorough mixing the mixture was exposed, for 60 minutes, to a BLAK-RAY UV Bench Lamp equipped with XX-15BLB bulbs. Each RICON 130MA8 oligomer chain was grafted, on average, with two molecules of alkoxysilane. The resulting product is identified as Compound C.

Reaction of RICON 156

Using conventional synthetic procedures, 10.0 g RICON 156 and 5.6 g of 3-mercaptopropyltriethoxysilane (1:4 mol) were heated to 130° C. under nitrogen in the presence of 0.31 g LUPERSOL 231 (peroxide from Elf Atochem). After thirty (30) minutes at peak temperature, the product was evacuated and allowed to cool to room temperature. The resulting product is identified as Compound D.

EXAMPLES 1–20

Table 1

Epoxy/Siloxy-Functional Encapsulant Compositions

All materials used to prepare Examples 1–20 are commercially available except for the siloxy-modified adhesion promoters, for which the method of making is described above. These treated materials were added to the formulation along with other ingredients in the order given in Table 1. The formulations were then mixed for five to ten minutes. After mixing, the formulations have a room temperature pot-life of >20 hours. Shelf life may be >6 months when refrigerated at −40° C.

The encapsulant compositions contain curatives, and in some cases catalysts or accelerators, which promote crosslinking to produce cured encapsulant structures after about two (2) hours at 150° C.

Failure of the comparative examples may be attributed to the absence or insufficient silane and/or silylated adhesion promoter as in example 5, 6, 7 and 13. This causes lack of adhesion leading to unsatisfactory performance under thermal shock test conditions. Example 1–3, 5–7 contain no viscosity modifier, while example 4, 8–21 include acrylic viscosity modifiers. Without the presence of viscosity modifier, silylated adhesion promoter such as Compound A, B, C, and D have to be added to secure thermal shock performance. Selections of type and amount of adhesion promoters are formulation dependent. Example 15–17 use fused silica LE05 and MK04 (available from JCI USA Inc.) to decrease CTE. Example 18 contains 23.17% nano-silica particle. This particular particle was made by treating amorphous silica sol surface with octyltriethoxysilane. The tensile strength of example 18 is higher than unfilled version.

crosslinking to produce cured encapsulant structures after about two (2) hours at 150° C.

Failure of the comparative examples may be attributed to lack of epoxy adhesion promoter (RSL 1462) as in Example 21 or too much epoxy adhesion promoter, as in Example 25,

TABLE 1

Epoxy/Siloxy-Functional Encapsulant Compositions

| Example Number | 1 | 2 | 3 | 4 | 5C | 6C | 7C |
|---|---|---|---|---|---|---|---|
| L 207 | 57.55% | 60.16% | 60.05% | 47.76% | 63.69% | 63.05% | 63.05% |
| PRIPOL 2033 | 5.76% | 12.03% | 12.01% | 4.78% | 12.74% | 12.61% | 12.61% |
| RICON 130MA8 | 5.76% | | | 14.33% | 9.55% | 9.46% | 9.46% |
| Compound A | 10.79% | | | | | | |
| Compound B | | 6.76% | | | | | |
| Compound C | | | 6.93% | | | | |
| Compound D | | | | 4.78% | | | |
| DDSA | 17.27% | 18.05% | 18.01% | 6.69% | 10.83% | 10.72% | 10.72% |
| IOA | | | | 14.33% | | | |
| A 187 | | | | | | 1.01% | |
| Y 11542 | | | | | | | 1.01% |
| Sartomer 350 | | | | 4.78% | | | |
| Lupersol 101 | | | | 0.19% | | | |
| Zn 2-Et Hexanoate | 2.88% | 3.01% | 3.00% | 2.39% | 3.18% | 3.15% | 3.15% |
| BYK 052 | <0.1% | <0.1% | <0.1% | <0.1% | <0.1% | <0.1% | <0.1% |
| Thermal Shock Test | Pass | Pass | Pass | Pass | Fail | Fail | Fail |
| Tg by DMA (° C.) | −26 | | | | | | |
| Pressure Cooker Test | Pass | Pass | Pass | Pass | Pass | Pass | Pass |
| Shore A | 46 | | | 64 | 29 | 28 | 28 |
| Shore A after 2 wks. 150° C. | 49 | | | 86 | 51 | 50 | 50 |

| Example Number | 8 | 9 | 10 | 11 | 12 | 13C | 14 | 15 | 16 | 17 | 18 | 19 | 20 |
|---|---|---|---|---|---|---|---|---|---|---|---|---|---|
| L 207 | 46.21% | 36.05% | 50.25% | 50.25% | 45.17% | 50.66% | 45.22% | 35.55% | 28.85% | 26.48% | 34.74% | 58.11% | 56.27% |
| LE 05 | | | | | | | | | 35.19% | | | | |
| MK 04 | | | | | | | | 23.07% | | 40.51% | | | |
| Nano Silica Particle | | | | | | | | | | | 23.17% | | |
| PRIPOL 2033 | 9.24% | 7.21% | 10.05% | 10.05% | 9.03% | 10.13% | 2.26% | 7.11% | 1.44% | 1.32% | 2.17% | 0.58% | 0.45% |
| Carbon Black | | | | | | 0.57% | | | 0.36% | 0.33% | | | 0.11% |
| RICON 130MA8 | 6.93% | 5.41% | 7.54% | 7.54% | 6.78% | 7.60% | 6.78% | 5.33% | 7.21% | 6.62% | 5.21% | 8.72% | 5.63% |
| Compound A | 8.78% | 28.84% | | | 8.58% | | 18.09% | 6.75% | 11.54% | 10.59% | 13.90% | | 5.63% |
| DDSA | 7.86% | 6.13% | 8.54% | 8.54% | 7.68% | 8.61% | 7.69% | 6.04% | 4.33% | 3.97% | 5.91% | | |
| MTHPA - EG | | | | | | | | | | | | 6.16% | 6.36% |
| IOA | 13.86% | 10.81% | 15.08% | 15.08% | | 15.20% | 13.57% | 10.66% | 8.65% | 7.94% | 10.42% | 17.43% | 16.88% |
| IBOA | | | | | 18.07% | | | | | | | | |
| A 187 | | 0.80% | | | | | | | | | | | |
| Y 11542 | | | | 0.80% | | | | | | | | 0.93% | |
| Sartomer 350 | 4.62% | 3.60% | 5.03% | 5.03% | 2.26% | 5.07% | 3.39% | 3.55% | 0.87% | 0.79% | 2.61% | 5.81% | 5.63% |
| Lupersol 101 | 0.18% | 0.14% | 0.20% | 0.20% | 0.18% | 0.20% | 0.18% | 0.14% | 0.12% | 0.11% | 0.14% | 0.23% | 0.23% |
| Zn 2-Et Hexanoate | 2.31% | 1.80% | 2.51% | 2.51% | 2.26% | 2.53% | 2.26% | 1.78% | 1.44% | | 1.74% | 2.03% | 2.81% |
| Zinc Stearate | | | | | | | | | | 1.32% | | | |
| BYK 052 | <0.1% | <0.1% | <0.1% | <0.1% | <0.1% | <0.1% | <0.1% | <0.1% | <0.1% | <0.1% | <0.1% | <0.1% | <0.1% |
| Thermal Shock Test | Pass | Pass | Pass | Pass | Pass | Fail | Pass | Pass | Pass | Pass | Pass | Pass | Pass |
| Tg by DMA (° C.) | −23 | −25 | | | | | −22 | −19 | −21 | | | | |
| Pressure Cooker Test | Pass | Pass | Pass | Pass | Pass | Pass | Pass | Pass | Pass | Pass | Pass | Pass | Pass |
| Shore A | 54 | | 50 | 51 | | 51 | | | 67 | | | 56 | |
| Shore A after 2 wks. 150° C. | 71 | | 64 | 64 | | 65 | | | | | | 82 | |

EXAMPLES 21–25

Table 2

Acrylate/Epoxy-Functional Encapsulant Compositions

All materials used to prepare Examples 21–25 are commercially available and may be mixed in the order given in Table 2. It is preferable to mix the TEAI with IOA before mixing the formulations. Formulations, with all indicated materials present, were mixed for five to ten minutes. After mixing, the formulations have a room temperature pot-life of more than 20 hours. Shelf life may be more than 6 months when refrigerated at −40° C.

The encapsulant compositions contain curatives, and in some cases catalysts or accelerators, which promote crosslinking to produce cured encapsulant structures after in which case there is a tendency for phase separation in the liquid oligomer composition. Lack of adhesion and phase separation both lead to unsatisfactory performance under thermal shock test conditions.

TABLE 2

Acrylate/Epoxy-Functional Encapsulant Compositions

| Example Number | 21C | 22 | 23 | 24 | 25C |
|---|---|---|---|---|---|
| TEAI 1000 | 78.43% | 74.54% | 71.22% | 71.22% | 65.35% |
| RSL 1462 | | 2.10% | 4.01% | 4.01% | 7.36% |
| DDSA | | 2.56% | 4.90% | 4.90% | 8.98% |
| IOA | 19.61% | 18.63% | 17.81% | 17.81% | 16.34% |

TABLE 2-continued

Acrylate/Epoxy-Functional Encapsulant Compositions

| Example Number | 21C | 22 | 23 | 24 | 25C |
|---|---|---|---|---|---|
| A 187 | 0.98% | 1.02% | 0.98% | 0.98% | 0.98% |
| Lupersol 101 | 0.98% | 0.93% | 0.89% | | 0.82% |
| Lupersol 231 | | | | 0.89% | |
| Zn 2-Et Hexanoate | | 0.21% | 0.20% | 0.20% | 0.18% |
| BYK 052 | <0.1% | <0.1% | <0.1% | <0.1% | <0.1% |
| Thermal Shock Test | Fail | Pass | Pass | Pass | Fail |
| Tg by DMA (° C.) | | −14 | −13 | −15 | −13 |
| Pressure Cooker Test | | Pass | Pass | Pass | Pass |
| Shore A | | 61 | 68 | 64 | 71 |
| Shore A after 2 wks. 150° C. | | 69 | 67 | 73 | 82 |

Method for Underfill and Encapsulation of Electronic Components

Compositions included in Table 1 (Parts 1 and 2) and Table 2 were tested primarily for their effectiveness as underfill materials. The reason for this is the requirement of complete filling of the space underneath circuit chips to provide maximum protection to the encapsulated features.

Standard techniques, involving dispensing of fluid from a suitably sized needle attached to a syringe, provided a means to flow underfill material between an electronic component and the surface of the substrate to which it was attached. When the encapsulant is dispensed, it flows as a two-dimensional wave-front under the die. Material flow is dependent on die size and shape, interconnect patterns, gap size, encapsulant and part heat. The key to success is having flexibility to match the pattern to the application so that the encapsulant underfills quickly, without having the wave fronts meet in such a way that they trap air.

After application of the underfill, the package was placed in an oven at 150° C. for two hours to promote curing. Thereafter, samples were subjected to testing using the methods previously described.

What is claimed is:

1. A thermomechanical-shock-resistant curable composition for solventless, hydrophobic resin encapsulation of electronic components, said composition comprising:
   a non-silicone oligomer including a flexible hydrocarbon backbone having reactive functionality selected from epoxy groups, (meth)acrylate groups, carboxyl groups, hydroxyl groups, isocyanate groups, amine groups, phenolic groups, anhydride groups, alkyd groups, cyanate ester groups, silyl groups, and mercapto groups;
   up to about 40% by weight of an adhesion promoter, and
   optionally, a viscosity-modifying component,
   wherein said composition has a glass transition temperature below 0° C. when cured.

2. A thermomechanical-shock-resistant it curable composition according to claim 1 wherein said reactive functionality is a reactive terminal functionality.

3. A thermomechanical-shock-resistant curable composition according to claim 1 wherein said flexible hydrocarbon backbone comprises from about 20 to about 700 carbon atoms.

4. A thermomechanical-shock-resistant curable composition according to claim 1 wherein said nonsilicone oligomer is formed from a monomer selected from the group consisting of butadiene, isoprene or 1,3, pentadiene, piperylene, methylpentadiene, phenylbutadiene, 3,4-dimethyl-1,3-hexadiene, 4,5-diethyl-1,3-octadiene, and isobutylene.

5. A thermomechanical-shock-resistant curable composition according to claim 1 wherein said adhesion promoter is selected from the group consisting of organofunctional silane coupling agents, alkoxy silane modified polyenes, alkoxy silane modified polyols and alkoxy silane modified polyanhydrides.

6. A thermomechanical-shock-resistant curable composition according to claim 1 further comprising at least one filler.

7. A thermomechanical-shock-resistant curable composition according to claim 6 wherein said filler is selected from the group consisting of clay, silane treated nanoparticle silicas having diameters of from about 4 to about 75 nm, fumed silica, fused silica, mineral quartz powder, fused quartz, aluminum oxide, glass powder, mica, kaolin, dolomite, graphite, soot, carbon fibers and textile fibers.

8. A thermomechanical-shock-resistant cured composition for solventless, hydrophobic resin encapsulation of electronic components, said cured composition comprising a plurality of polymers forming an interpenetrating polymer network produced by thermally curing a liquid composition comprising:
   a non-silicone oligomer including a flexible hydrocarbon backbone having reactive functionality selected from epoxy groups, (meth)acrylate groups, carboxyl groups, hydroxyl groups, isocyanate groups, amine groups, phenolic groups, anhydride groups, alkyd groups, cyanate ester groups, silyl groups, and mercapto groups;
   up to about 40% of an adhesion promoter; and
   a viscosity-modifying component,
   wherein said cured composition has a glass transition temperature below 0° C.

9. A thermomechanical-shock-resistant cured composition according to claim 8 wherein said reactive functionality is a reactive terminal functionality.

10. A thermomechanical-shock-resistant cured composition according to claim 8 wherein said flexible hydrocarbon backbone comprises from about 20 to about 700 carbon atoms.

11. A thermomechanical-shock-resistant cures composition according to claim 8 wherein said nonsilicone oligomer is formed from a monomer selected from the group consisting if butadiene, isoprene or 1,3, pentadiene, piperylene, methylpentadiene, phenylbutadiene, 3,4-dimethyl-1,3,-hexadiene, and 4,5-diethyl-1,3-octadiene.

12. A thermomechanical-shock-resistant cured composition according to claim 8 wherein said adhesion promoter is selected from the group consisting of epoxies, organofunctional silane coupling agents, alkoxy silane modified polyenes, alkoxy silane modified polyols and alkoxy silane modified polyanhydrides.

13. A thermomechanical shock-resistant cured composition according to claim 8 wherein said viscosity-modifying component is selected from isooctyl acrylate, isobornyl acrylate, 2-ethylhexyl acrylate, benzyl acrylate, butyl acrylate, 4-cyanobutyl acrylate, 2-cyanoethyl acrylate, cyclohexyl acrylate, 2-ethoxyethyl acrylate, 2-ethoxypropyl acrylate, ethyl acrylate, 2-ethylbutyl acrylate, heptyl acrylate, hexyl acrylate, isobutyl acrylate, 2-methylbutyl acrylate, 3-methylbutyl acrylate, nonyl acrylate, 3-pentyl acrylate, propyl acrylate, dodecyl methacrylate, 2-ethylhexyl methacrylate, octyl methacrylate, 1,4-butanediol diacrylate, and 1,6-hexandiol diacrylate.

14. A thermomechanical-shock-resistant cured composition according to claim 8 further comprising at least one filler.

15. A thermomechanical-shock-resistant cured composition according to claim 14 wherein said filler is selected from the group consisting of clay, silane treated nanoparticle silicas having diameters of from about 4 to about 75 nm, fumed silica, fused silica, mineral quartz powder, fused quartz, aluminum oxide, glass powder, mica, kaolin, dolomite, graphite, soot, carbon fibers and textile fibers.

16. A thermomechanical-shock-resistant cured composition according to claim 5 wherein said organofunctional silane coupling agent is an isocyanatoalkyltrialkoxy silane coupling agent.

17. A thermomechanical-shock-resistant cured composition according to claim 12 wherein said organofunctional silane coupling agent is an isocyanatoalkyltrialkoxy silane coupling agent.

* * * * *

UNITED STATES PATENT AND TRADEMARK OFFICE
CERTIFICATE OF CORRECTION

PATENT NO. : 6,664,318 B1
DATED : December 16, 2003
INVENTOR(S) : Bymark, Richard M.

It is certified that error appears in the above-identified patent and that said Letters Patent is hereby corrected as shown below:

<u>Column 6,</u>
Line 52, delete "improvments" and insert -- improvements --

<u>Column 20,</u>
Line 39, delete "cures" and insert -- cured --
Line 42, delete "if" and insert -- of --

Signed and Sealed this

Third Day of August, 2004

JON W. DUDAS
*Acting Director of the United States Patent and Trademark Office*